(12) United States Patent
Ke

(10) Patent No.: US 10,910,078 B1
(45) Date of Patent: Feb. 2, 2021

(54) METHOD OF FORMING A ONE-TIME-PROGRAMMING (OTP) BIT

(71) Applicant: NS POLES TECHNOLOGY CORP., Zhuhai (CN)

(72) Inventor: Yu Chou Ke, Zhuhai (CN)

(73) Assignee: NS Poles Technology Corp., Zhubai (CN)

( * ) Notice: Subject to any disclaimer, the term of this patent is extended or adjusted under 35 U.S.C. 154(b) by 0 days.

(21) Appl. No.: 16/896,447

(22) Filed: Jun. 9, 2020

(30) Foreign Application Priority Data

Dec. 24, 2019 (TW) .............................. 108147353 A

(51) Int. Cl.
| | | |
|---|---|---|
| *G11C 17/16* | (2006.01) | |
| *G11C 17/14* | (2006.01) | |
| *G11C 11/16* | (2006.01) | |
| *G11C 17/18* | (2006.01) | |
| *G11C 16/22* | (2006.01) | |

(52) U.S. Cl.
CPC ........ *G11C 17/165* (2013.01); *G11C 11/1675* (2013.01); *G11C 16/225* (2013.01); *G11C 17/146* (2013.01); *G11C 17/18* (2013.01)

(58) Field of Classification Search
CPC . G11C 17/165; G11C 11/1675; G11C 16/225; G11C 17/146; G11C 17/18
See application file for complete search history.

(56) References Cited

U.S. PATENT DOCUMENTS

| | | | | | |
|---|---|---|---|---|---|
| 5,463,244 | A | * | 10/1995 | De Araujo | .......... H01L 23/5252 257/15 |
| 2017/0023618 | A1 | * | 1/2017 | Douglass | ............... G11C 17/16 |

* cited by examiner

Primary Examiner — Han Yang
(74) *Attorney, Agent, or Firm* — Rosenberg, Klein & Lee

(57) ABSTRACT

In a method of forming a one-time-programming (OTP) bit, a thin-film memory device is provided, which includes at least one memory element and a transistor, and the memory element is coupled to the transistor in series. Then, an alternating current is applied to the memory element and the transistor, the power applied to the memory element is constrained, and the transistor is turned on to change the resistance of the memory element for a plurality of cycles of the alternating current until the resistance of the memory element is irreversibly changed.

10 Claims, 5 Drawing Sheets

METHOD OF FORMING A ONE-TIME-PROGRAMMING (OTP) BIT

This application claims priority for Taiwan patent application no. 108147353 filed on Dec. 24, 2019, the content of which is incorporated by reference in its entirely.

BACKGROUND OF THE INVENTION

Field of the Invention

The present invention relates to a method of forming a bit, particularly to a method of forming a one-time-programming (OTP) bit.

Description of the Prior Art

Thin film memory devices, such as magnetic random access memories (MRAM), typically comprise a tunneling barrier which is capable of representing two resistance states. Breakdown to the tunneling barrier creates a permanent third state with lower resistance comparing to the two resistance states before barrier breakdown. This third state is used for OTP (one-time programming) but the wide resistance distribution makes it prone to the read failure and circuit complexity. Also, it is desired to operate with a lower the barrier breakdown voltage for the sake of power consumption and a smaller select transistor size.

To overcome the abovementioned problems, the present invention proposes a method of forming a OTP bit to resolve the afore-mentioned problems of the prior art.

SUMMARY OF THE INVENTION

The primary objective of the present invention is to provide a method of forming a OTP bit, which uses a bipolar current to stress a thin-film memory device and constrains the power applied to the memory device, thereby achieving a lower breakdown voltage and tighter distribution of the post-breakdown resistance.

In order to achieve the abovementioned objectives, the present invention proposes a method of forming a OTP bit, which comprises providing a thin-film memory device, which comprises at least one memory element and a transistor, and the at least one memory element is coupled to the transistor in series; and applying an alternating current to the at least one memory element and the transistor, constraining power applied to at least one memory element, and turning on the transistor to change a resistance of the memory element for a plurality of cycles of the alternating current until the resistance of at least one memory element is irreversibly changed.

In one embodiment of the present invention, the transistor is a metal-oxide-semiconductor field effect transistor (MOSFET).

In one embodiment of the present invention, the at least one memory element is a magnetoresistive random access memory (MRAM) with a magnetic tunnel junction (MTJ), a one-time-programming resistive component, a phase-change memory, a conductive bridge random access memory (CBRAM), a ferroelectric random access memory (FeRAM), a ferroelectric tunnel junction random access memory (FTJRAM), or a resistive random-access memory (RRAM).

In one embodiment of the present invention, the absolute value of the alternating current is at least 25% higher than the absolute value of a current required to write the memory element.

In one embodiment of the present invention, the period of the plurality of cycles could range from 0.2 to 200 ns.

In one embodiment of the present invention, the alternating current applied to the at least one memory element is constrained to certain level for all bits.

In one embodiment of the present invention, the alternating current comprises a positive current component and a negative current component.

In one embodiment of the present invention, the transistor is turned on after applying the alternating current to the at least one memory element and the transistor and constraining the power applied to the at least one memory element.

In one embodiment of the present invention, the alternating current is applied to the at least one memory element and the transistor and the power applied to the at least one memory element is constrained after turning on the transistor.

In one embodiment of the present invention, the power applied to the at least one memory element is constrained to decrease with time.

Below, embodiments are described in cooperation with the attached drawings to make easily understood the objectives, technical contents, characteristics and accomplishments of the present invention.

DETAILED DESCRIPTION OF THE INVENTION

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to."

The phrases "be coupled with," "couples with," and "coupling with" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Figure 1:
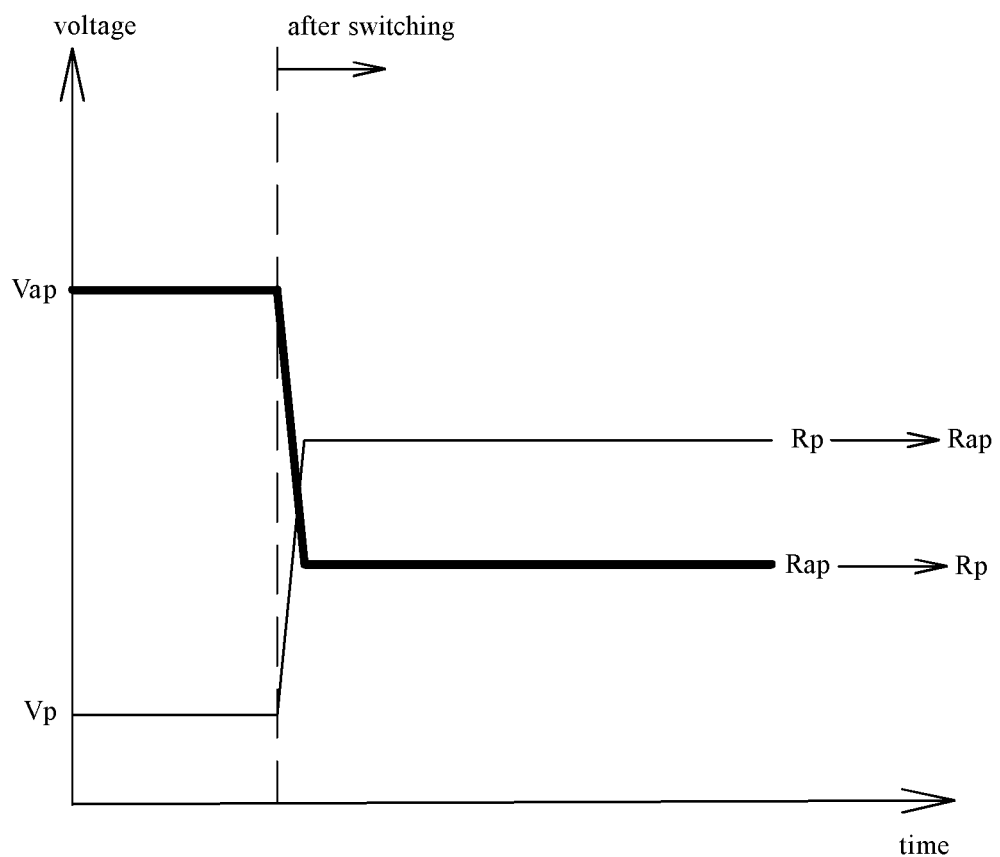
FIG. 1 is a diagram schematically illustrating a voltage waveform across a memory element after switching according to an embodiment of the present invention.

Referring to FIG. 1, a method of forming a one-time-programming (OTP) bit is introduced. The memory element of the present invention may be a magnetoresistive random access memory (MRAM) with a magnetic tunnel junction (MTJ) or a resistive random-access memory (RRAM). As illustrated in FIG. 1, the memory element has two kinds of tunneling barriers respectively represent two resistances Rap and Rp. When the resistance of the memory element is Rap, a positive constant current is applied to the memory element for 1~100 ns, such that the resistance of the memory element decreases from Rap to Rp. As a result, the absolute value of the voltage drop across the memory element decreases from Vap. When the memory element has resistance Rp, a negative constant current is applied to the memory element for 1~100 ns, such that the resistance of the memory element increases from Rp to Rap. As a result, the absolute value of the voltage drop across the memory element increases from Vp. The positive constant current and the negative constant current flow through the memory element in opposite directions and have the same absolute value.

Figure 2:
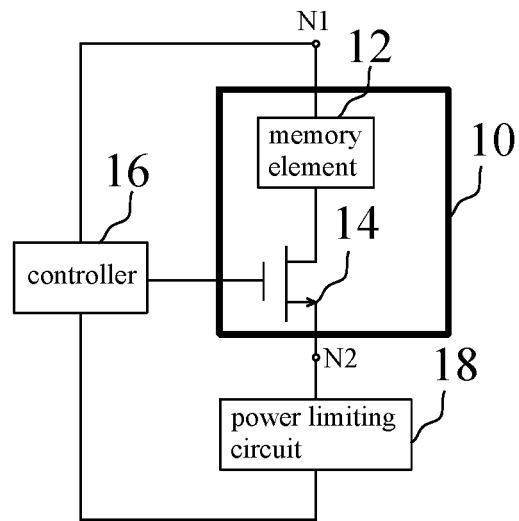
FIG. 2 is a diagram schematically illustrating a thin-film memory device, a controller, and a current limiting circuit according to an embodiment of the present invention.

Referring to FIG. 2, a thin-film memory device 10, which comprises at least one memory element 12 and a transistor 14, is provided. The memory element 12 is coupled to the transistor 14 in series. The memory element 12 may be a magnetoresistive random access memory (MRAM) with a magnetic tunnel junction (MTJ), a one-time-programming resistive component, a phase-change memory, a conductive bridge random access memory (CBRAM), a ferroelectric random access memory (FeRAM), a ferroelectric tunnel junction random access memory (FTJRAM), or a resistive random-access memory (RRAM), but the present invention is not limited thereto. The one-time-programming resistive component may be an antifuse. The antifuse consists of one or more contacts or vias and insulators thereamong. Alternatively, the antifuse is formed by coupling the gate of a complementary metal-oxide-semiconductor field effect transistor (MOSFET) to the body of the complementary MOSFET. The complementary MOSFET includes a gate oxide layer as an insulator. The transistor 14 may be a MOSFET, but the present invention is not limited thereto. An end N1 of the thin-film memory device 10 is coupled to a controller 16 and another end N2 of the thin-film memory device 10 is coupled to the controller 16 through a power limiting circuit 18.

Figure 3:
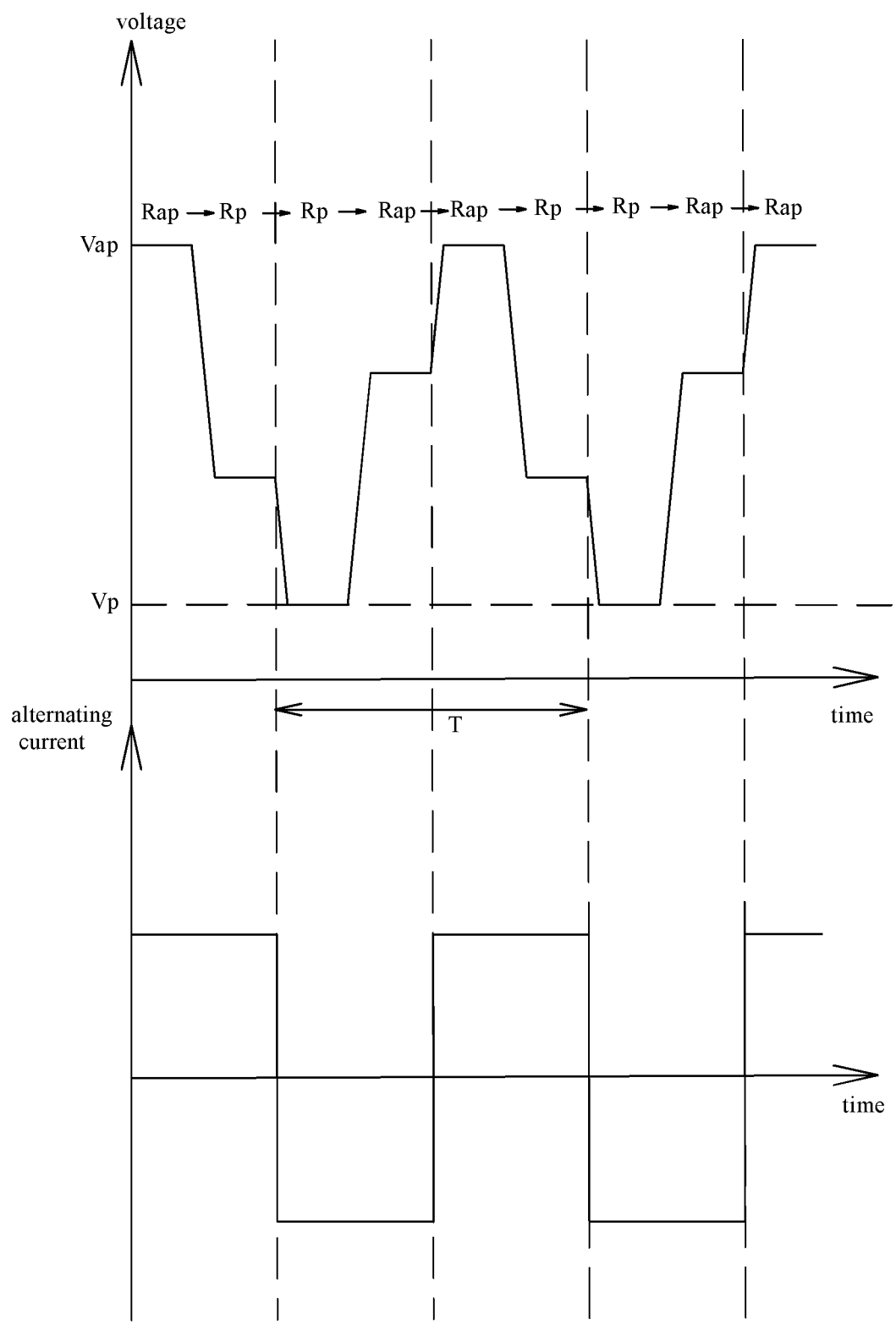
FIG. 3 are diagrams illustrating waveforms of the absolute value of a voltage across a memory element and an alternating current according to an embodiment of the present invention.

Referring to FIG. 2 and FIG. 3, the variation of the voltage drop across the memory element is introduced. An alternating current is applied to the memory element 12 and the transistor 14, the power limiting circuit 18 constrains power applied to the memory element 12, and the controller 16 turns on the transistor 14 to change the resistance of the memory element 12 for a plurality of cycles Ti of the alternating current until the resistance of the memory element 12 is irreversibly changed. When the resistance of the memory element 12 is irreversibly changed, the breakdown event occurs at the memory element 12.

For example, the absolute value of the alternating current is at least 25% higher than the absolute value of a current required to write the memory element 12. Each of the plurality of cycles T ranges from 0.2 to 200 ns, but the present invention is not limited thereto. Specifically, the alternating current includes a positive current component and a negative current component. The absolute value of the positive current is the same to that of the negative current. The positive current and the negative current flow through the memory element 12 in opposite directions. In some embodiment of the present invention, the controller 16 turns on the transistor 14 after the controller 16 applies the alternating current to the memory element 12 and the transistor 14 and the power limiting circuit 18 constrains the power applied to the memory element 12. Alternatively, the controller 16 applies the alternating current to the memory element 12 and the transistor 14 and the power limiting circuit 18 constrains the power applied to the memory element 12 after the controller 16 turns on the transistor 14.

When the resistance of the memory element 12 is Rap, the controller 16 provides a positive current for the memory element 12 and the transistor 14 such that the resistance of the memory element 12 decreases from Rap to Rp. Thus, the absolute value of the voltage drop across the two ends of the memory element 12 decreases from Vap. Then, the controller 16 provides a negative current for the memory element 12 and the transistor 14, the absolute value of the voltage drop across the two ends of the memory element 12 decreases to Vp. Afterwards, the resistance of the memory element 12 increases from Rp to Rap. Thus, the voltage drop across the two ends of the memory element 12 increases from Vp. When the controller 16 provides the positive current for the memory element 12 and the transistor 14 once again, the absolute value of the voltage drop across the two ends of the memory element 12 increases to Vap. Then, the voltage drop across the two ends of the memory element 12 decreases from Vap since the resistance of the memory element 12 decreases from Rap to Rp. When the alternating current is applied to the thin-film memory device 10, the breakdown event occurs at the memory element 12 rapidly since the high voltage Vap is applied repeatedly.

Figure 4:
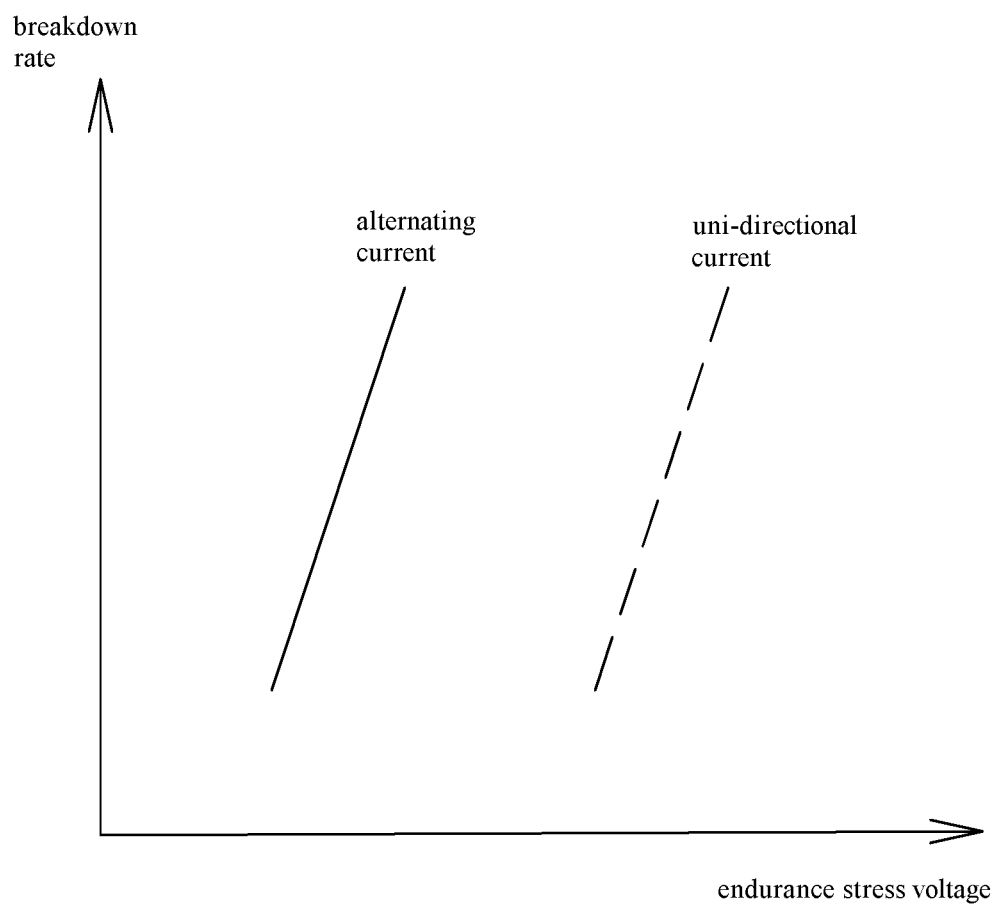
FIG. 4 is a diagram illustrating breakdown rates corresponding to breakdown voltages of an alternating current and a uni-directional current according to an embodiment of the present invention.

Referring to FIG. 2 and FIG. 4, the present invention applies the alternating current to the thin-film memory device 10. Compared with the unidirectional current, the high voltage can be repeatedly applied due to the alternating current. As a result, the breakdown voltage of the thin-film memory device 10 is lower.

Figure 5:
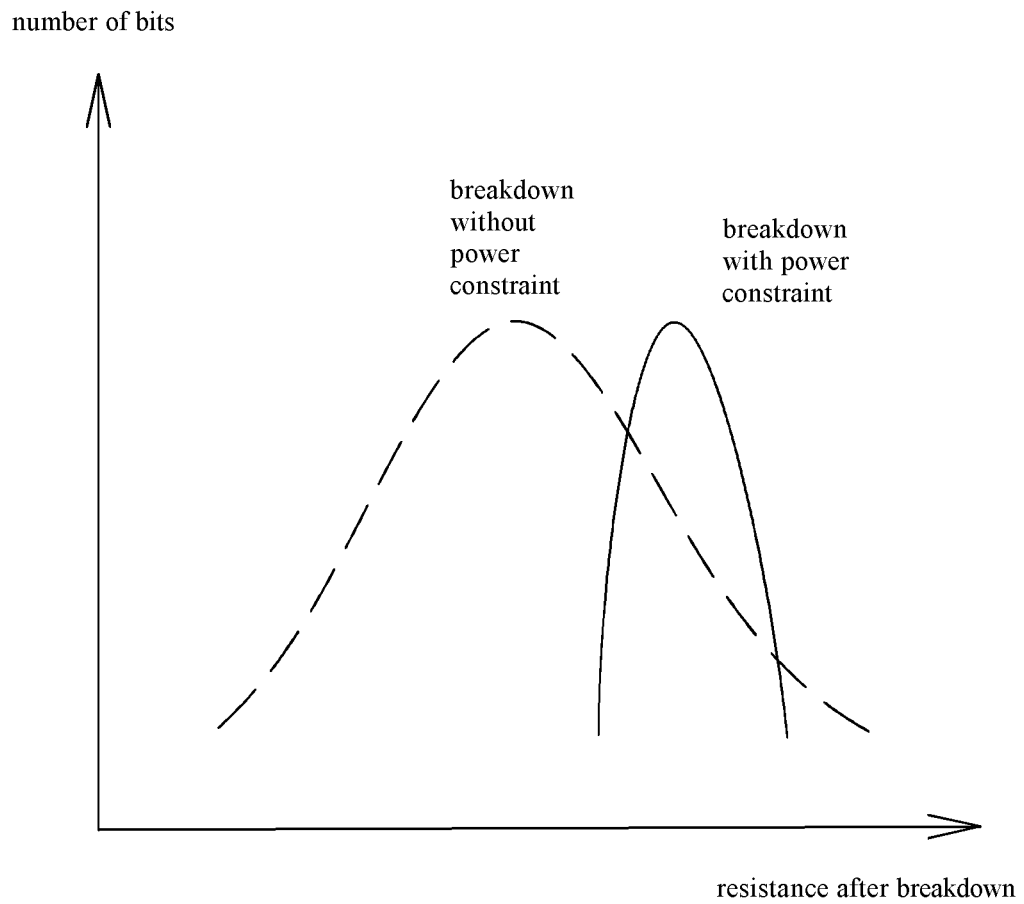
FIG. 5 is a diagram illustrating the resistance distribution after breakdown when the breakdown is made with or without a power constraint according to an embodiment of the present invention.

As illustrated by the dotted line of FIG. 5, if the thin-film memory device 10 has a plurality of memory elements 12 and does not have the power limiting circuit 18, the alternating current is applied metal atoms to easily enter into junctions of the memory elements 12, thereby achieving looser distribution of the post-breakdown resistances of the memory elements 12. It is difficult to read data and operate with the memory elements 12 when the post-breakdown resistances of the memory elements 12 are widely distributed. In order to overcome the problem, the present invention designs the power limiting circuit 18 for limiting power provided to the memory element 12. For example, the power limiting circuit 18 may be implemented with a current limiting circuit. The current limiting circuit is used to limit currents provided to the memory elements 12 and narrow the post-breakdown resistances of the memory elements 12, as illustrated by the solid line in FIG. 5. In some embodiments of the present invention, the power limiting circuit 18 constrains power provided to the memory elements 12, wherein the power decreases with time in order to narrow the post-breakdown resistances of the memory elements 12. For example, the power provided to the memory elements 12 by the power limiting circuit 18 at a previous cycle is higher than the power provided to the memory elements 12 by the power limiting circuit 18 at a next cycle.

In conclusion, the present invention uses a bipolar current to stress a thin-film memory device and constrains the power applied to the memory device, thereby achieving a lower breakdown voltage and tighter distribution of the post-breakdown resistance and reducing the size of the memory element.

The embodiments described above are to demonstrate the technical thoughts and characteristics of the present invention to enable the persons skilled in the art to understand, make, and use the present invention. However, these embodiments are not intended to limit the scope of the present invention. Any equivalent modification or variation according to the spirit of the present invention is to be also included within the scope of the present invention.

What is claimed is:

1. A method of forming a one-time-programming (OTP) bit comprising:
   providing a thin-film memory device, which comprises at least one memory element and a transistor, and the at least one memory element is coupled to the transistor in series; and
   applying an alternating current to the at least one memory element and the transistor, constraining power applied to the at least one memory element, and turning on the transistor to change a resistance of the at least one memory element for a plurality of cycles of the alternating current until the resistance of the at least one memory element is irreversibly changed.

2. The method of forming the OTP bit according to claim 1, wherein the transistor is a metal-oxide-semiconductor field effect transistor (MOSFET).

3. The method of forming the OTP bit according to claim 1, wherein the at least one memory element is a magnetoresistive random access memory (MRAM) with a magnetic tunnel junction (MTJ), a one-time-programming resistive component, a phase-change memory, a conductive bridge random access memory (CBRAM), a ferroelectric random access memory (FeRAM), a ferroelectric tunnel junction random access memory (FTJRAM), or a resistive random-access memory (RRAM).

4. The method of forming the OTP bit according to claim 1, wherein an absolute value of the alternating current is at least 25% higher than an absolute value of a current required to write the at least one memory element.

5. The method of forming the OTP bit according to claim 1, wherein each of the plurality of cycles ranges from 0.2 to 200 ns.

6. The method of forming the OTP bit according to claim 1, wherein in the step of constraining the power, the alternating current applied to the at least one memory element is constrained.

7. The method of forming the OTP bit according to claim 1, wherein the alternating current comprises a positive current component and a negative current component.

8. The method of forming the OTP bit according to claim 1, wherein in the step of applying the alternating current to the at least one memory element and the transistor, constraining the power applied to the at least one memory element, and turning on the transistor, the transistor is turned on after applying the alternating current to the at least one memory element and the transistor and constraining the power applied to the at least one memory element.

9. The method of forming the OTP bit according to claim 1, wherein in the step of applying the alternating current to the at least one memory element and the transistor, constraining the power applied to the at least one memory element, and turning on the transistor, the alternating current is applied to the at least one memory element and the transistor and the power applied to the at least one memory element is constrained after turning on the transistor.

10. The method of forming the OTP bit according to claim 1, wherein the limit of the power constraint decreases with time.

* * * * *

UNITED STATES PATENT AND TRADEMARK OFFICE
CERTIFICATE OF CORRECTION

PATENT NO. : 10,910,078 B1  
APPLICATION NO. : 16/896447  
DATED : February 2, 2021  
INVENTOR(S) : Yu Chou Ke Page 1 of 1

It is certified that error appears in the above-identified patent and that said Letters Patent is hereby corrected as shown below:

On the Title Page

At item (73):
"NS Poles Technology Corp., Zhubai (CN)" should read -- NS Poles Technology Corp., Zhuhai (CN) --

Signed and Sealed this  
Twenty-third Day of November, 2021

Drew Hirshfeld  
*Performing the Functions and Duties of the*  
*Under Secretary of Commerce for Intellectual Property and*  
*Director of the United States Patent and Trademark Office*